United States Patent
Chen et al.

[11] Patent Number: 6,077,761
[45] Date of Patent: Jun. 20, 2000

[54] METHOD FOR FABRICATING A TRANSISTOR GATE WITH A T-LIKE STRUCTURE

[75] Inventors: Weng-Yi Chen, Chupei; Kuen-Chu Chen, Hsinchu Hsien, both of Taiwan

[73] Assignee: United Integrated Circuit Corp., Hsinchu, Taiwan

[21] Appl. No.: 09/206,178

[22] Filed: Dec. 4, 1998

[30] Foreign Application Priority Data

Jul. 24, 1998 [TW] Taiwan ................................ 87112105

[51] Int. Cl.$^7$ ................................................... H01L 21/28
[52] U.S. Cl. ........................ 438/574; 438/578; 438/182; 438/303; 438/572
[58] Field of Search .................................. 438/574, 576, 438/579, 182, 150, 294, 303

[56] References Cited

U.S. PATENT DOCUMENTS

| | | | |
|---|---|---|---|
| 5,646,435 | 7/1997 | Hsu et al. ................................ | 257/382 |
| 5,688,704 | 11/1997 | Liu ............................................ | 437/41 |
| 5,744,395 | 4/1998 | Shue et al. .............................. | 438/305 |

OTHER PUBLICATIONS

Wolf, S. Silicon Processing for the VLSI Era, vol. 2: Process Integration. Lattice Press, 1990. pp. 67–69, 556–557, 1990.

Primary Examiner—Donald L. Monin, Jr.
Assistant Examiner—Ginette Peralta
Attorney, Agent, or Firm—Jiawei Huang; J.C. Patents

[57] ABSTRACT

A method for fabricating a field effect transistor (FET) with a T-like gate structure includes forming a silicon nitride layer over a silicon substrate and patterning it to form an opening that exposes the substrate. A dielectric layer is formed on a lower portion of each side-wall of the opening so that the opening has a T-like free space. A doped polysilicon layer fills the T-like free space through only one deposition. After performing a planarization on the doped polysilicon layer, a titanium metal layer is formed over the substrate. A self-aligned titanium silicide is formed over the substrate other than the dielectric layer surface through a rapid thermal process (RTP). A selective etching process is performed to remove the remaining titanium metal layer. After removing the dielectric layer a RTP is performed again to reform the crystal structure of the titanium silicide layer so as to reduce its resistance. A T-like gate structure is formed.

24 Claims, 5 Drawing Sheets

US 6,077,761

METHOD FOR FABRICATING A TRANSISTOR GATE WITH A T-LIKE STRUCTURE

CROSS-REFERENCE TO RELATED APPLICATION

This application claims the priority benefit of Taiwan application serial no. 87112105, filed Jul. 24, 1998, the full disclosure of which is incorporated herein by reference.

BACKGROUND OF THE INVENTION +ps 1.
Field of the Invention

This invention relates to semiconductor fabrication for a T-like transistor gate, and more particularly to a method for fabricating a field effect transistor (FET) gate with a T-like structure, in which the improved T-like structure has low resistance and can avoid damage to the gate oxide layer during an etching fabrication process.

2. Description of Related Art

FIG. 1 is a cross-sectional view of a conventional field effect transistor. In FIG. 1, a field effect transistor (FET) includes two interchangeable source/drain regions 14 formed in a semiconductor substrate 10 and a gate 12 formed over the substrate 10 between the interchangeable source/drain regions 14. There is a gate oxide layer 16 between the gate 12 and the substrate 10. The formation of the interchangeable source/drain regions 14 usually includes a thermal process for driving-in the implanted ions so that there is an overlap region 18 overlapping with the gate 12. This induces an undesired capacitor effect between the gate 12 and the interchangeable source/drain regions 14. The existence of the overlap region 18 causing an increase of capacitance results in a decrease of the operational speed of the FET and an increase of the power dissipation. Moreover, the existence of the overlap region 18 increases a probability that hot electrons can easily inject into the gate oxide layer 16 to reform the threshold voltage, which may affect the working voltage and FET performances.

A conventional technology, called lightly doped drain (LDD) technology, is proposed to solve hot electrons problems. The LDD structure has a lightly doped region to replace the overlap region 18 of FIG. 1. However, the LDD structure still has some problems of high series resistance and power dissipation. Another conventional method is proposed to form a FET with a T-like-structure gate, which is described below.

FIGS. 2A–2C are cross-sectional views of a semiconductor device schematically illustrating a conventional fabrication process for a FET with a T-like-structure gate. In FIG. 2A, an oxide layer 22, a polysilicon layer 24, and a metal layer 26 having a high melting point are sequentially formed over a semiconductor substrate 20, which is a P-type substrate. A photoresist layer 27 is formed on the metal layer 26 to define a region for the gate structure.

In FIG. 2B, using the photoresist layer 27 as an etching mask, a plasma etching process is performed to pattern the metal layer 26 and the polysilicon layer 24. Since the etching rate of the polysilicon layer 24 is three times faster than that of the metal layer 26, the polysilicon layer 24 is etched more. The remaining metal layer 26 and the remaining polysilicon layer 24 form together as a T-like gate of the FET, which is to be formed.

In FIG. 2B and FIG. 2C, after removing the photoresist layer 27 and the oxide layer 22 other than the region covered by the polysilicon 24, the remaining oxide layer 22 is a gate oxide layer of the FET. A process of implanting ions is performed to dope the exposed region of the substrate 20. Thus, two interchangeable source/drain regions 29 are formed in the substrate 20 on each side of the T-like gate 28. The FET is then accomplished. In this conventional example, the interchangeable source/drain regions 29 have no overlap region 18 of FIG. 1 with the T-like gate 28.

However, the FET shown in FIG. 2C still has several problems. For example, the resistance of the metal layer 26 increases because the width of the T-like gate 28 is reduced, and the plasma etching process used to form the T-like gate 28 may easily cause damage to the T-like gate 28. Moreover, because the formation of the T-like structure includes at least two deposition processes and makes use of a different etching rate between metal layer 26 and polysilicon layer 24, the fabrication complexity and uncertainty increase.

SUMMARY OF THE INVENTION

It is therefore an objective of the present invention to provide a method for fabricating a FET with an improved T-like gate structure, which is formed by only performing one deposition process.

It is another objective of the present invention to provide a method for fabricating a FET with an improved T-like gate structure, which is formed without a plasma etching process so as to maintain the stability of the improved T-like gate.

It Is still another an objective of the present invention to provide a method for fabricating an FET with an improved T-like gate structure, which is formed by using self-aligned technology. Hence the method can use an i-line light source in a photolithography process at a dimension of about 0.25 microns or even as low as about 0.18 microns.

It is yet still another objective of the present invention to provide a method for fabricating a FET with an improved T-like gate structure, which has low resistance.

In accordance with the foregoing and other objectives of the present invention, a method for fabricating a FET with an improved T-like gate structure is provided. The method includes sequential formation of a pad oxide layer and a silicon nitride layer, and a photoresist layer with a pattern to expose a region of the silicon nitride for the formation of the T-like gate structure over a semiconductor substrate. A shallow trench isolation (STI) structure has been formed in the semiconductor substrate to isolate the FET. The silicon nitride layer within the exposed region is removed by, for example, dry etching to form an opening, which exposes the pad oxide layer.

After removing the photoresist layer, a stopper layer and a dielectric layer are formed over the substrate so that the stopper layer and the dielectric layer are conformal to the top surface of the substrate. The stopper layer includes silicon nitride. An etching back process, for example, is performed to remove the dielectric layer by using the stopper layer as an etching end point so that the remaining dielectric layer is the portion on each side-wall of the opening. An over-etching process is performed to further remove a top portion of the remaining dielectric layer so that a top portion of each side-wall of the opening is also exposed. The unoccupied space of the opening therefore has a T-like structure. After removing the stopper layer, the pad oxide layer within the T-like opening is exposed. The exposed pad oxide layer is removed and a gate oxide layer is formed to take the place of the removed portion of the pad oxide layer. A polysilicon layer is deposited over the substrate. Using the silicon nitride layer as a polishing stop layer, a planarization process, such as chemical mechanical polishing (CMP) process, is performed to expose the silicon nitride layer. The remaining polysilicon layer fills the T-like opening to form a T-like polysilicon layer, which is to serve as the main portion of the T-like gate.

A titanium metal layer and a titanium nitride layer are sequentially formed over the substrate. A rapid thermal process (RTP) is performed to form a titanium silicide layer with a self-aligned property through a reaction between titanium metal layer and silicon contained in the silicon substrate and the polysilicon layer. A selective etching process is performed to remove the remaining titanium metal layer and the titanium silicide layer. Since the selective etching process is not a plasma etching process, the gate oxide layer is not damaged. The remaining dielectric layer on each sidewall of the remaining T-like polysilicon layer is removed. A process of RTP is performed to reform the crystal structure of the titanium silicide layer so as to reduce its resistance. The T-like gate including the remaining T-like polysilicon layer and the titanium silicide layer is formed.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
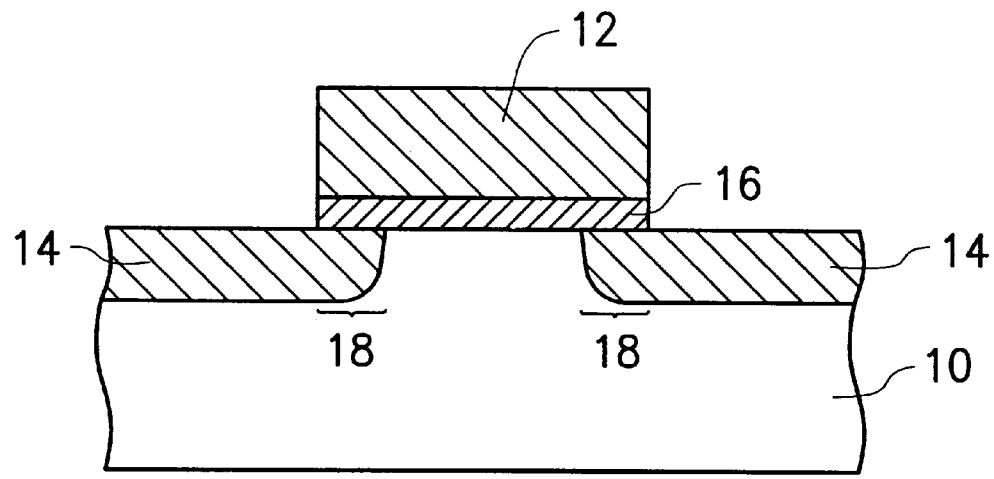
FIG. 1 is a cross-sectional view of a conventional field effect transistor.
Figure 2A:
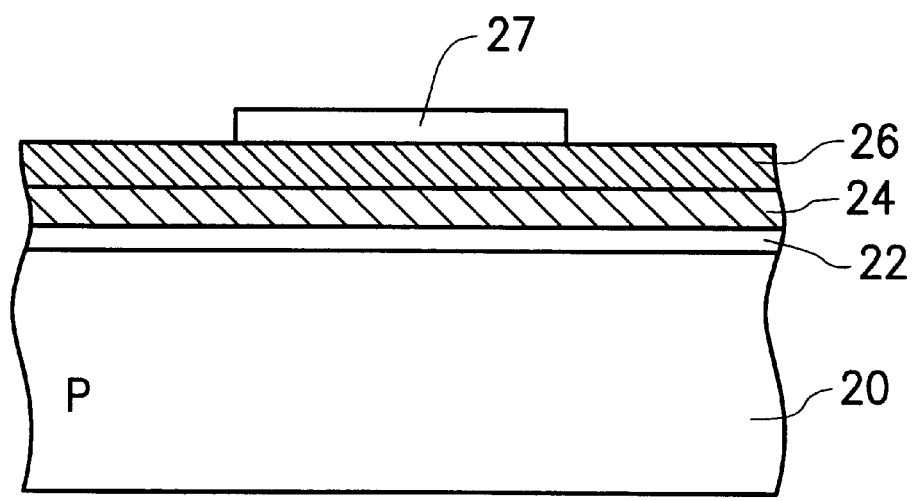
FIGS. 2A–2C are cross-sectional views of a semiconductor device schematically illustrating a conventional fabrication process for a FET with a T-like-structure gate.
Figure 2B:
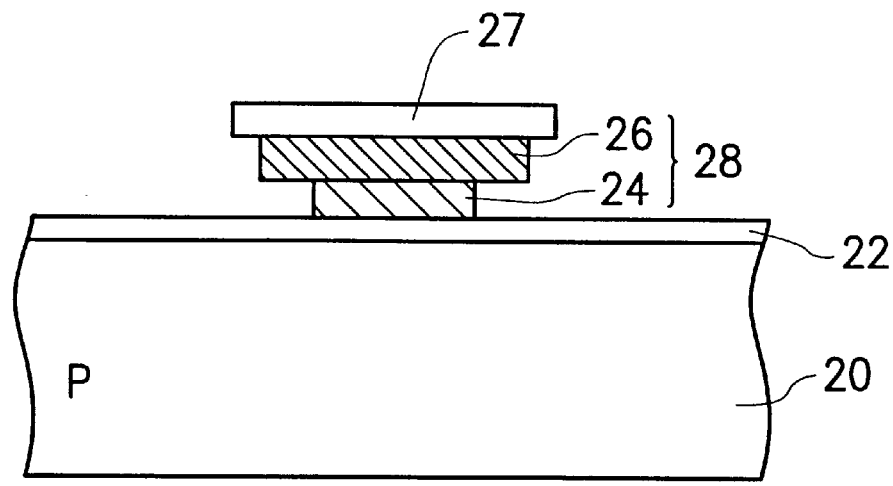
Figure 2C:
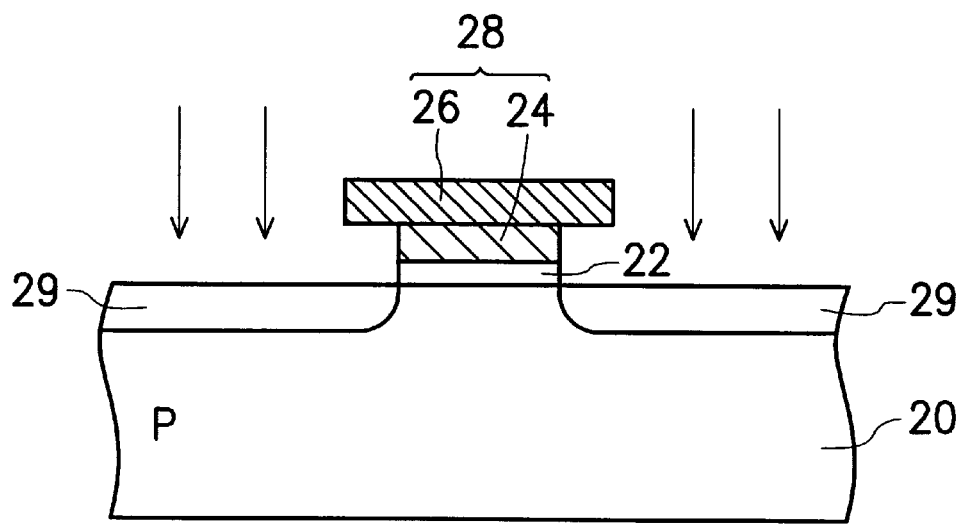
Figure 3A:
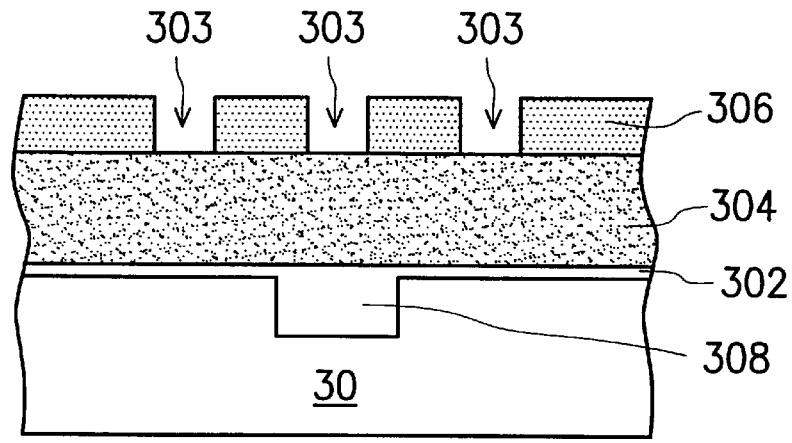
FIGS. 3A–3I are cross-sectional views of a semiconductor device schematically illustrating an improved fabrication process for a FET with a T-like-structure gate, according to a preferred embodiment of the invention.

FIGS. 3A–3I are cross-sectional views of a semiconductor device schematically illustrating an improved fabrication process for a FET with a T-like-structure gate, according to a preferred embodiment of the invention. In FIG. 3A, a pad oxide layer 302, a hard layer 304, such as a silicon nitride layer, and a photoresist layer 306 are formed over a semiconductor substrate 30, such as a silicon substrate. The substrate 30 includes an isolation structure 308, such as a shallow trench isolation (STI) structure. An opening 303 is formed in the photoresist layer 306 by, for example, photolithography and etching to expose a portion of the silicon nitride layer 304.

Figure 3B:
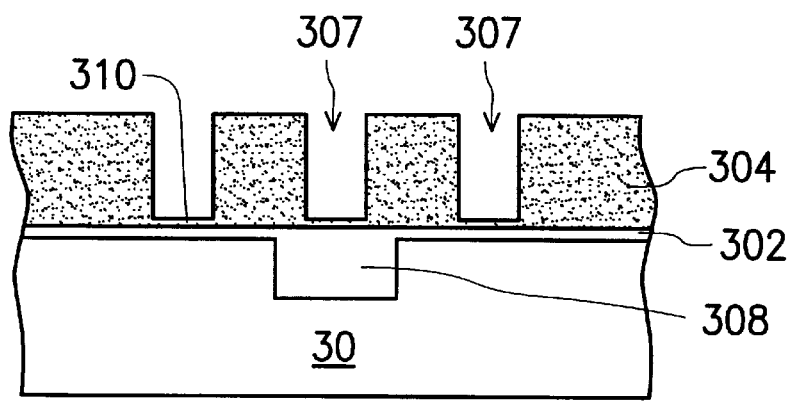

In FIG. 3B, using the photoresist layer 306 as an etching mask, the hard layer 304 is patterned by, for example, dry etching to form an opening 307 that exposes the pad oxide 302. After removing the photoresist layer 306, a stopper layer 310 is formed over the hard layer 304. The stopper layer 310 includes the same material as that of the hard layer, such as silicon nitride, so that the stopper layer 310 covers the pad oxide layer 302 within the opening 307.

Figure 3C:
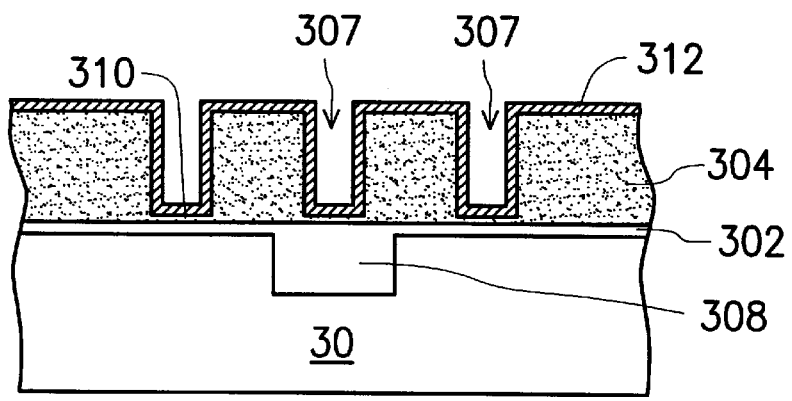
Figure 3D:
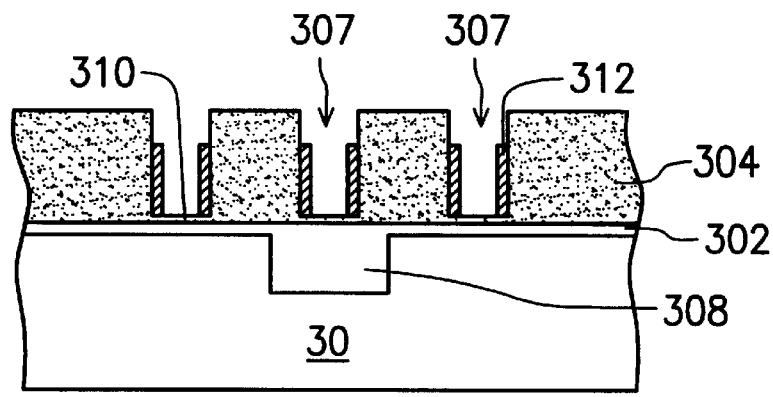

In FIG. 3C, a dielectric layer 312 is formed over the substrate 30. The formation of the dielectric layer 312 includes, for example, tetra-ethyl-ortho-silicate (TEOS) through low pressure chemical vapor deposition (LPCVD). In FIG. 3D, an etching back process is performed to remove the dielectric layer 312 so that the hard layer 304 is exposed. The remaining dielectric layer 312 serving as a spacer is on each sidewall of the opening 307. An over-etching process is performed to remove a top portion of the remaining dielectric layer 312 so that the opening 307 has a T-like free space. The stopper layer 310 serves as a stop layer to protect the pad oxide 302 within the opening 307 from the over-etching process.

Figure 3E:
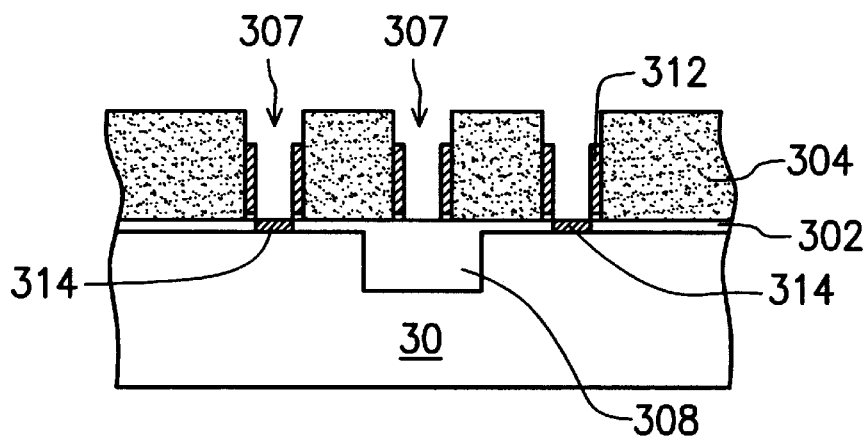

In FIG. 3E, the stopper layer 310 and the pad oxide layer 302 within the opening 307 are removed by, for example, dry etching or phosphoric acid ($H_3PO_4$) so that the substrate 30 within the opening 307 is exposed. A gate oxide layer 314 is formed by, for example, thermal process.

Figure 3F:
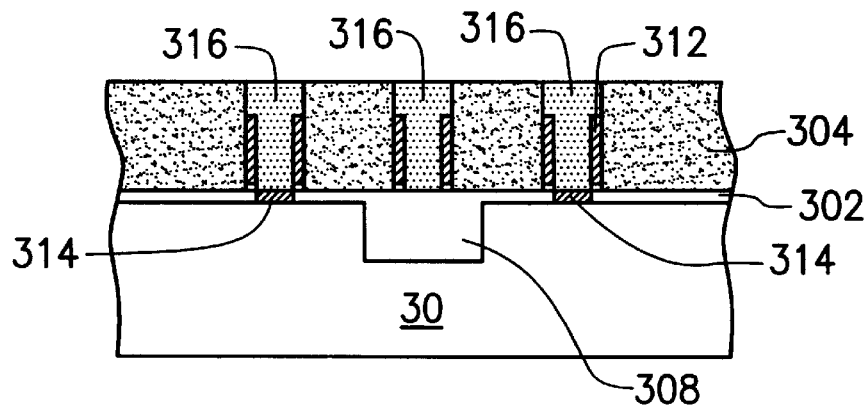
Figure 3G:
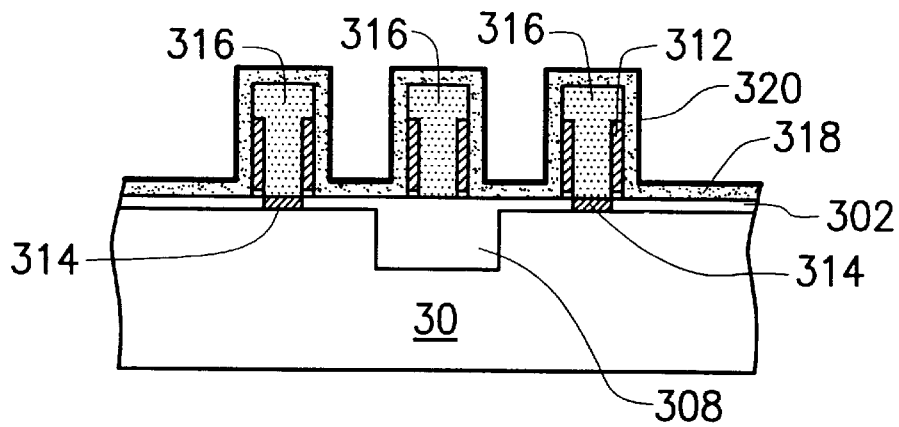

In FIG. 3F, a polysilicon layer 316 is formed to fill the free space of the opening 307. The polysilicon layer 316 is preferably doped while performing deposition, for example. The formation of the doped polysilicon layer 316 is formed through depositing a pre-polysilicon layer (not shown) over the substrate to fill the opening 307 (FIG. 3E), and then performing a planarization process, such as a chemical mechanical polishing (CMP) process. After the CMP process the silicon nitride layer is exposed again, and the remaining pre-polysilicon layer filling the T-like free space of the opening 307 of FIG. 3E is the doped polysilicon layer 316. The doped polysilicon layer 316 is the main body of the T-like gate, which is formed through only one deposition. In FIG. 3F and FIG. 3G, the silicon nitride layer 304 is removed to expose a portion of the pad oxide layer 302. A titanium metal layer 318 and a titanium nitride layer 320 are sequentially formed over the substrate 30. The titanium metal layer 318 preferably is formed through sputtering, and the titanium nitride layer 320 is preferably formed through deposition.

Figure 3H:
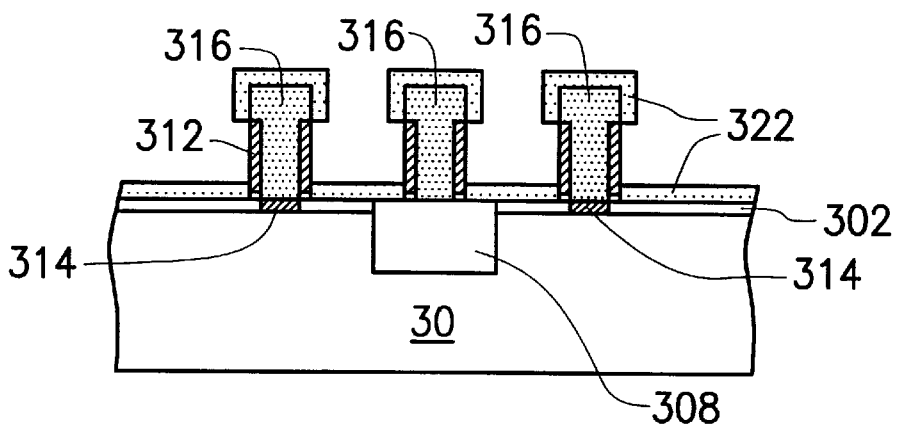

In FIG. 3G and FIG. 3H, a thermal process, such as a rapid thermal process (RTP), is performed to form a titanium silicide layer 322 with a self-aligned property through a reaction between silicon in the substrate 30 and the doped polysilicon layer 316 and the titanium metal layer 318. A selective etching process is then performed to remove the remaining titanium metal layer 318 and the titanium nitride layer 320. Because the selective etching process is not a plasma etching process, the damage to the gate oxide layer 314 is avoided. Since the dielectric layer 312 does not react with the titanium metal layer 318, there is no titanium silicide layer 322 on it. The titanium silicide layer 322 is formed through self-aligned technology so that it can be fabricated in a dimension of about 0.25 microns or even about 0.18 microns. This is highly suitable for the development of deep sub-micron fabrication technology.

Figure 3I:
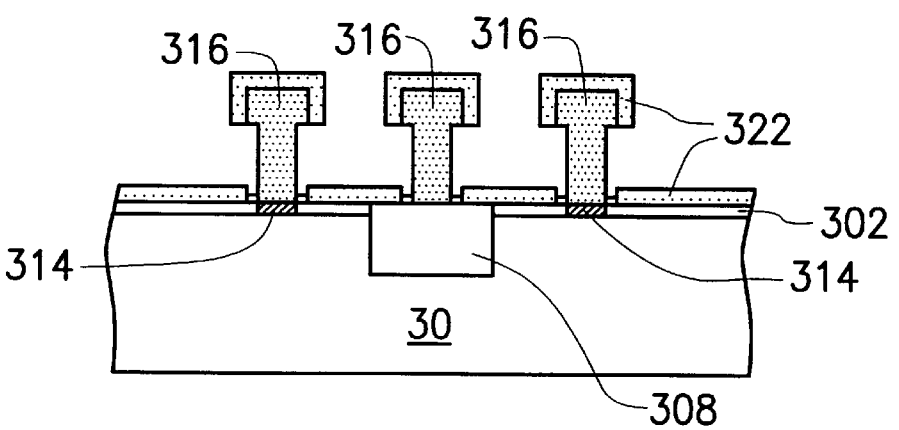

In FIG. 3H and FIG. 3I, after removing the dielectric layer 312, a thermal process, such as RTP, is performed again to reform the crystal structure of the titanium silicide layer 322 from C49 structure to C54 structure so as to reduce the resistance. The T-like gate including the doped polysilicon layer 316 and the titanium silicide layer 322 is formed, in which the doped polysilicon layer 316 is preferably doped. An interchangeable source/drain region (not shown) can be formed on each side of the T-like gate by implanting ions.

In conclusion the method of the invention for fabricating an improved T-like gate structure, which can be used in a FET, has several advantages as follows:

1. The improved method includes only one deposition process for forming the doped polysilicon layer 316.
2. The improved method includes a selective etching process to remove titanium metal layer 318 and the titanium nitride layer 320 so as to avoid damage to the gate oxide layer 314.
3. The improved method includes a self-aligned technology to form the titanium silicide layer 322 so that the improved method is highly suitable for the development of the deep sub-micron fabrication technology.

4. The improved method includes a thermal process, such as RTP, to reform the crystal structure of the titanium silicide 322 so as to reduce its resistance, which results in a faster operation speed.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a T-like gate, the method comprising:

forming a pad oxide layer over a semiconductor substrate;

forming a hard layer on the pad oxide layer;

patterning the hard layer to form an opening in the hard layer to expose a portion of the pad oxide layer;

forming a stopper layer over the substrate, wherein the stopper layer at least covers the exposed portion of the pad oxide layer;

depositing a dielectric layer over the substrate, wherein the dielectric layer also covers an inner peripheral surface of the opening;

removing the dielectric layer other than the portion on each sidewall of the opening so that the remaining dielectric layer covers the inner peripheral surface of the opening;

removing a top portion of the remaining dielectric layer on each sidewall of the opening and a bottom portion of the remaining dielectric layer so that the opening has a T-like free space and the stopper layer within the opening is exposed;

removing the stopper layer to expose the pad oxide layer within the opening;

removing the exposed portion of the pad oxide layer to expose the substrate;

forming a gate oxide layer on the exposed substrate within the opening;

forming a polysilicon layer to fill the T-like free space of the opening, wherein the polysilicon layer and the remaining dielectric layer contact each other;

removing the hard layer to expose a top portion of the polysilicon layer;

forming a titanium metal over the substrate;

forming a titanium nitride layer over the titanium metal layer;

performing a first thermal process to form a self-aligned titanium silicide at least over the exposed top portion of the polysilicon layer;

removing the remaining titanium metal layer and the remaining titanium nitride layer through a selective etching process;

removing the remaining dielectric layer so that the T-like gate is formed, wherein a lower portion of the polysilicon layer originally covered by the remaining dielectric layer is exposed; and performing a second thermal process to reform a crystal structure of the titanium silicide layer so as to reduce its resistance.

2. The method of claim 1, wherein the improved T-like gate is used in a field effect transistor (FET) serving as a transistor gate.

3. The method of claim 1, wherein the substrate comprises silicon.

4. The method of claim 1, wherein the substrate comprises a shallow trench isolation (STI) structure in the substrate.

5. The method of claim 1, wherein in the step of forming the hard layer, the hard layer comprises silicon nitride.

6. The method of claim 1, wherein in the step of forming the stopper layer, the stopper layer comprises the same material as that of the hard layer.

7. The method of claim 6, wherein the stopper layer comprises silicon nitride.

8. The method of claim 1, wherein the step of forming the dielectric layer comprises tetra-ethyl-ortho-silicate (TEOS), which is deposited by low pressure chemical vapor deposition (LPCVD).

9. The method of claim 1, wherein the step of removing the dielectric layer to expose the hard layer and the pad oxide comprises an etching back process.

10. The method of claim 1, wherein the step of removing the top portion of the remaining dielectric layer comprises an over-etching process.

11. The method of claim 1, wherein the step of removing the stopper layer comprises phosphoric acid ($H_3PO_4$).

12. The method of claim 1, wherein the step of removing the stopper layer comprises dry etching.

13. The method of claim Is wherein the step of forming the polysilicon layer to fill the T-like free space of the opening further comprises:

depositing a primary polysilicon layer over the substrate; and performing a chemical mechanical polishing (CMP) process to planarize the primary polysilicon and again expose the hard layer.

14. The method of claim 13, wherein the polysilicon layer is doped so as to reduce its resistance.

15. The method of claim 1, wherein the step of removing the hard layer comprises an etching process with phosphoric acid ($H_3PO_4$).

16. The method of claim 1, wherein the step of forming the titanium metal layer comprises a sputtering process.

17. The method of claim 1, wherein the step of forming the titanium nitride layer comprises a deposition process.

18. The method of claim 1, wherein the step of performing the first thermal process to form the self-aligned titanium silicide layer comprises a rapid thermal process (RTP).

19. The method of claim 1, wherein the step of performing the second thermal process to reform the crystal structure of the titanium silicide layer comprises a rapid thermal process (RTP).

20. The method of claim 19, wherein the crystal structure is reformed from a C49 structure to a C54 structure, in which the C54 structure has less resistance than that of the C49 structure.

21. A method for fabricating a T-like gate on a semiconductor substrate having a pad oxide layer and a hard layer sequentially formed over the substrate, the method comprising:

patterning the hard layer to form an opening in the hard layer, wherein the opening exposes the pad oxide layer;

depositing a stopper layer over the substrate, wherein the stopper layer at least covers a bottom surface of the opening;

forming a dielectric sidewall layer on each sidewall of the opening at a lower portion so that the opening has a T-like free space, wherein the stopper layer is used as an etching stop during forming the dielectric sidewall layer;

removing the stopper layer to expose the pad oxide layer within the opening;

removing the exposed portion of the pad oxide layer to expose the substrate;

forming a gate oxide layer on the exposed substrate within the opening;

forming a polysilicon layer to fill the T-like free space of the opening, wherein the polysilicon layer and the dielectric sidewall layer contact each other;

removing the hard layer to expose a top portion of the polysilicon layer;

forming a self-aligned silicide at least over the exposed top portion of the polysilicon layer;

removing the dielectric sidewall layer so that the T-like gate is formed, wherein a lower portion of the polysilicon layer originally covered by the dielectric sidewall layer is exposed; and performing a second thermal process to reform a crystal structure of the titanium silicide layer so as to reduce its resistance.

22. The method of claim 21, wherein the substrate comprises silicon.

23. The method of claim 21, wherein the self-aligned silicide layer comprises titanium silicide.

24. The method of claim 21, wherein the hard layer comprises silicon nitride.

* * * * *